Feb. 3, 1970 R. B. SEPE 3,493,872
VARIABLE DIVISION FREQUENCY DIVIDER
HAVING NOR GATE COUPLING LOGIC
Filed June 2, 1967

INVENTOR
RAYMOND B. SEPE
BY Irving S. Rappaport
ATTORNEY

United States Patent Office 3,493,872
Patented Feb. 3, 1970

3,493,872
VARIABLE DIVISION FREQUENCY DIVIDER HAVING NOR GATE COUPLING LOGIC

Raymond B. Sepe, Johnston, R.I., assignor to Raytheon Company, Lexington, Mass., a corporation of Delaware Filed June 2, 1967, Ser. No. 643,134
Int. Cl. H03k 23/26
U.S. Cl. 328—39 4 Claims

ABSTRACT OF THE DISCLOSURE

A digitally controlled frequency divider comprising means for providing an input frequency signal, a divider control means for encoding the desired divisor and producing control signals, and a logic matrix for producing the desired output frequency signal including a plurality of cascaded flip-flops and gating circuits, said input frequency signal toggling each flip-flop having all ONE's preceding it unless all flip-flops are in the ONE state and an inhibiting ZERO is received from said divider control means.

BACKGROUND OF THE INVENTION

There are many applications in electronic equipment for programing and timing of electronic systems, electronic data processing and computer applications in which it is desirable to have a digitally controlled frequency divider. Conventional designs of frequency dividers have certain limitations due to transmission time and/or race conditions.

The present invention provides a digitally controlled frequency divider which overcomes the limitations of the prior art designs. The divider is a clocked divider which may operate at the maximum frequency attainable by the individual components. The divider of the present invention is extremely adaptable to integrated circuits. Entire sections of the divider may be manufactured on a single silicon chip and long dividers may be made by cascading the basic sections. The division performed by the divider may be remotely controlled by a shaft encoder and register. Thus, the divider of the present invention may be employed as an *n*-bit programmable divider.

The division scheme utilized in the divider of the present invention is such that the counter is driven from state to state in its entire sequence of states uniformly, at the rate of the input frequency. Thus, the input frequency may be allowed to attain the maximum rated response frequency of the logic circuits employed.

Such prior art dividers as "between-clock-pulse preset" and "unstable state" schemes for altering the normal binary counting sequence often require that the input frequency be less than ½ the maximum rated response frequency of the logic circuits employed. In addition, the input frequency of the divider circuit of the present invention may be divided by any integer from 1 to $2^n$, where $n$ is the number of flip-flops cascaded in the divider. Digitally encoded divider control orders provide remote control of the divider. Further the divider utilizes integrated circuits in a simultaneous carry division scheme. It is repetitive in two bit groups and therefore especially well suited to modular construction on printed circuit cards. As many two bit groups as desired may be cascaded to provide a division as large as may be required for a particular application. The entire divider is made of two types of components—NOR gates and J-K flip flops.

SUMMARY OF THE INVENTION

A digitally controlled frequency divider comprising means for providing an input signal, a divider control means for encoding the desired divisor and producing control signals, and a logic matrix for producing the desired output frequency signal including a plurality of cascaded flip-flops and gating circuits, said input frequency signal toggling each flip-flop having all ONE's preceding it unless all flip-flops are in the ONE state and inhibiting ZERO is received from said divider control means.

DESCRIPTION OF THE PREFERRED EMBODIMENTS

Figures 1, 2:
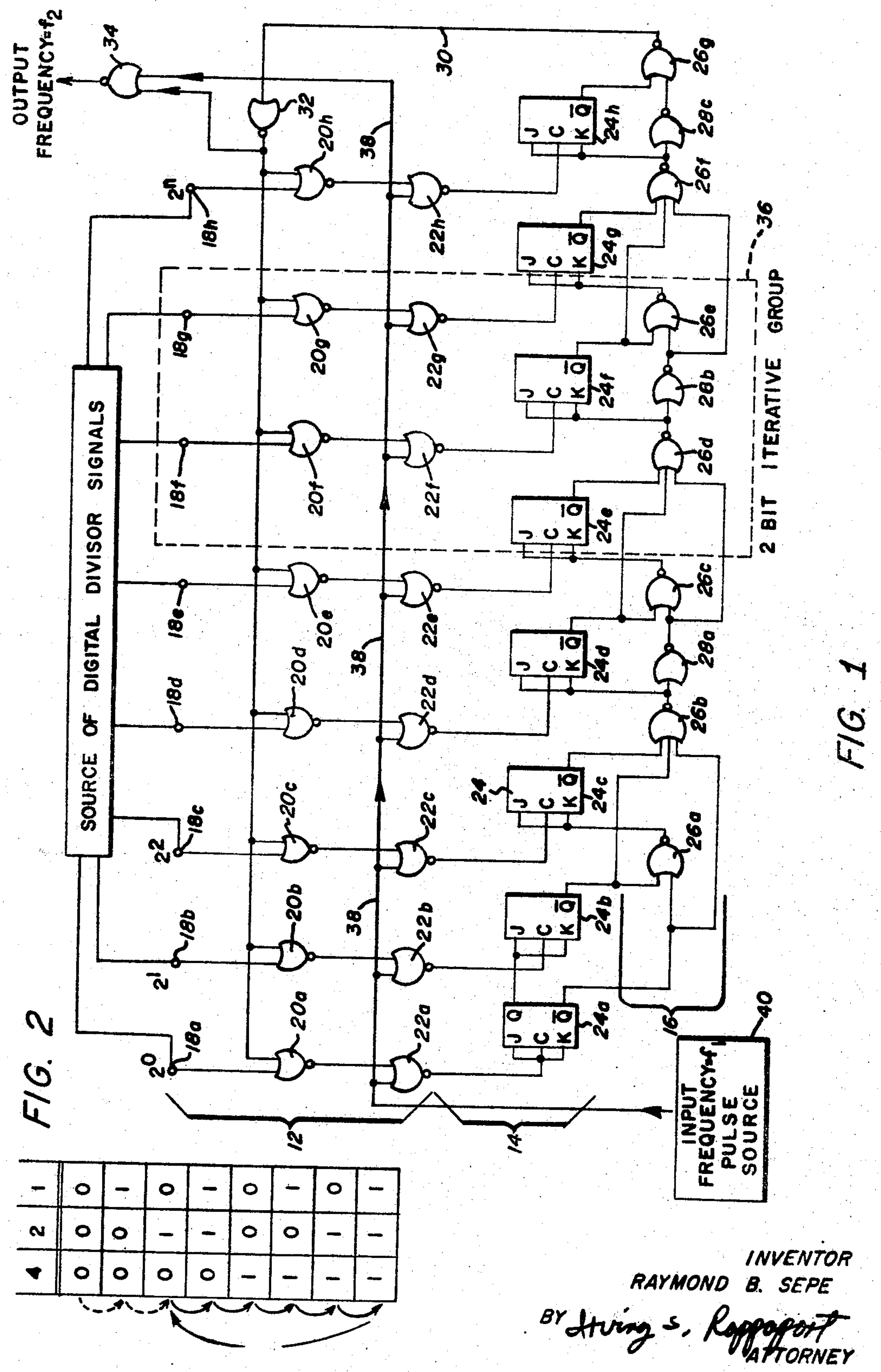
FIG. 1 is a logic circuit diagram showing the digitally controlled frequency divider of the present invention.
FIG. 2 is a table illustrating the sequential operation of the divider shown in FIG. 1.

Referring now to FIGURE 1 of the drawings, there is shown a variable divisor digitally controlled frequency divider having NOR gate coupling logic. Broadly, the frequency divider comprises a digital counter 14 and an input signal frequency gating logic arrangement 16 for applying pulses from a source 40 to the counter 14. Another gating arrangement 12 also operates to modify the counter 14 stages through the application thereto of a digitally encoded divisor signal. This other logic arrangement also presets the counter prior to repeating a new counting cycle without the need for a separate recycling pulse. This results in a time saving and circuit simplification by minimizing the number of counter stages which must have their internal stable state changed in order for the counter to be reset.

Two different logic elements are used. These are respectively called NOR gates, as for example elements 20 and 26, and the JK flip-flops, as for example element 24. Each of the elements has a characteristic truth table, which for purposes of completeness are here included.

It is characteristic of digital practice to utilize storage and switching elements which are capable of two different stable states. Examples of such storage and switching elements are bistable electronic flip-flops or square loop bistable remanent magnetic material. Because there exist a number of ways of implementing the two valued logic and corresponding signals, it is sufficient for purposes of describing this invention to define a binary 1 as a first D.C. level and a binary 0 as another D.C. level. Thus, a conventional AND gate would yield 1 output only in the joint presence of 1's on its input leads.

Where a device such as a bistable flip-flop is discussed, its internal state shall be referred to as being in a first or second stable state. In this regard, the truth table definition of logic functions hereinafter described have reference only to the input and output signal conditions of the logic element or device. From this elementary discussion, attention can now be directed to the "truth tables" defining the NOR gate and the JK flip-flop.

TABLE 1.—NOR GATE TRUTH TABLE

| a | b | Q | $\overline{Q}$ |
|---|---|---|---|
| 0 | 0 | 0 | 1 |
| 0 | 1 | 1 | 0 |
| 1 | 0 | 1 | 0 |
| 1 | 1 | 0 | 1 |

Referring to Table 1, the NOR output $\overline{Q}$ generates a 1 only upon the joint presence or joint absence of 1's on the input leads $a$ and $b$. As is evident, the NOR gate represents the negation output of an "exclusive OR" gate.

TABLE 2.—JK FLIP-FLOP TRUTH TABLE

| $J^t$ | $K^t$ | $Q^{t+1}$ | $\overline{Q}^{t+1}$ |
|---|---|---|---|
| 0 | 0 | $Q^t$ | $\overline{Q}^t$ |
| 0 | 1 | 0 | 1 |
| 1 | 0 | 1 | 0 |
| 1 | 1 | $\overline{Q}^t$ | $Q^t$ |

Referring now to Table 2, the inputs to the flip-flop are applied to terminals J and K with the output Q and its complement $\overline{Q}$ being responsive to the condition of the JK terminals and also to the prior output condition. Thus, at time $t+1$ the condition of the flip-flop will be determined by the inputs J and K at the earlier time $t$. Accordingly, if J and K at time $t$ are both 0, then the output $\overline{Q}$ at time $t+1$ stays the same as it was at time $t$. However, if J and K at time $t$ are both 1, then the $\overline{Q}$ output at time $t+1$ changes to the output that existed at output Q at time $t$. Lastly, if the JK input at time $t$ was either 01 or 10, then the corresponding $\overline{Q}$ output at time $t+1$ would be 1 and 0 respectively. In Boolean notation $$Q^{t+1}=Q^t\overline{K}^t+\overline{Q}^tJ^t$$

Reference for these and additional details can be made to "Arithmetic Operations in Digital Computers" by R. K. Richards, D. Van Nostrand and Co., New York, 1955. Library of Congress 55–6234; "Automatic Digital Computers" by M. B. Wilkes, John Wiley & Sons, New York, 1956; and most particularly, "Logical Design of Digital Computers" by Montgomery Phister, Jr., John Wiley & Sons, New York, 1959, Library of Congress 58–6082, especially at pages 128 to 129 and 134 to 135.

Referring again to FIGURE 1 of the drawing, coupling logic 12 comprises a plurality of parallel connected NOR gates 20*a–h* with a separate NOR gate connected in series with each input terminal 18*a–h*. The signal on each of the terminals 18*a–h* corresponds to one bit of a binary number. Illustratively, the left most input terminal 18*a* corresponds to the $2^0$ digit position. The next terminal 18*b* corresponds to the $2^1$ digit position. Likewise, the last terminal 18*h* corresponds to the $2^n$ digit position.

In series with each of the NOR gates 20*a–h* are corresponding gates of another series of NOR gates 22*a–h*. Each gates of this other series drives at least one input of a corresponding JK flip-flop 24*a–h*. One terminal of each of the NOR gates 22*a–h* is activated by a pulse train from pulse source 40 having a predetermined repetition frequency. Each of the pulses in the train represents a binary 1.

As previously mentioned, the end result or effect of the NOR gate logic elements 20*a–h* and 22*a–h* is to apply the divisor and the input frequency to the counter 41 so as to divide down the input frequency to a lower output frequency. Relatedly, JK flip-flops 24*a–h* are coupled so as to form the cascaded stages of a binary counter. These stages in combination with toggle logic 16 form the counting means 14.

Toggle logic 16 comprises a series of NOR gates 26 and 28. One of these, for example NOR gate 26*a*, is connected between the output of JK flip-flop 24*a* and 24*b* and the input of the next successive flip-flop 24*c*. NOR gates 28*a*, 28*b*, and 28*c* act as logical inverters. That is, in response to a 0 on its input a 1 appears on its output and vice versa. These inverters are coupled between successive NOR gates 26*b* and 26*c*, and also 26*d* and 26*e* and 26*f* and 26*g*.

A feedback path 30 includes NOR gate inverter 32. Path 30 lies between the output of NOR gate 26*g* and the second input to each of the NOR gates 20*a–h*. The path is also connected to output NOR gate 34 by connector 35.

Output NOR gate 34 is driven by signals respectively on lines 36 and 35. If a binary 1 signal is present on line 35, each time a binary 1 signal or pulse is present on line 36, then the output frequency $f_2$ is equal to the input frequency $f_1$. In order for the input frequency $f_1$ to be equal to the output frequency $f_2$, there can only be a binary 0 signal present on all of the terminals 18*a* through 18*h*. A binary 0 on each of these inputs insures, according to Table 1, that an output 0 will appear from each of the NOR gates 20*a–h*, and 22*a–h*. This further makes certain that there will be no change of state of flip-flops 24*a–h* due to signals on inputs 18*a–h*. This also implies that the signal present on path 30 at the output of NOR gate 26*g* is 0.

Block 36 represents a two-bit iterative group constituting a basic section which can be cascaded to build a digital divider for division by any desirable integer from 1 to $2^n$. Each two-bit iterative group 36 includes a pair of input terminals 18*f* and 18*g*, NOR gates 20*f*, 20*g* and 22*f*, 22*g*, JK flip-flops 24*f*, 24*g*, and toggle logic NOR gates 26*d*, 28*b*, and 26*e*.

Referring now to flip-flop 24*d*, this element will be toggled by a pulse applied on line 36 if flip-flops 24*a*, 24*b*, and 24*c* have a 1 output at their $\overline{Q}$ output terminals. This toggle action will be inhibited if all of the counter bistable storage elements 24*a–h* have an output $Q=1$. Meanwhile, the divider control input on terminals 18*a–h* is everywhere 0. The gating, as shown, permits an applied input signal of pulse repetition frequency of $f_1$ to drive the counter 14 through a normal binary counting sequence up to and including the point where $n$ stages are all in the first stable state.

During the normal counting sequence of flip-flops 24*a–h*, their output Q are not all binary 1's. Correspondingly, the complement output $\overline{Q}$ are also not all 0. Until the counter has counted up to its full range, the Q output of flip-flop 24*h* will be 0. Thus, the $\overline{Q}$ output will be a 1. Also, until the counter has gone through its entire sequence, the output of NOR gate 28*c* is also a 1. This means that the signal on feedback path 30 is normally 1, which in turn is inverted through NOR gate 32 to apply a 0 on path 35. Since the output frequency NOR gate 34 has a 0 state applied to 1 of its inputs, it will not pass signals present on path 36 therethrough. However, when the counting sequence of the counter reaches a point where the Q out of flip-flop 24*h* becomes 1, then the $\overline{Q}$ changes to a 0 resulting in a 0 signal being applied to path 30 through NOR gate 26*g*. The 0 is converted into a 1 signal by NOR gate 32 and applied to path 35. This thereby conditions gate 34 to pass corresponding signals on path 36 therethrough. Since line 30 will have a 1 signal impressed on it, then the 1 or 0 signals respectively applied to terminals 18*a–h* will be gated through NOR gates 20*a–h*. Those signals from NOR gates 20*a–h* which are binary 1 will allow the input pulse train from source 40 on path 36 to pass through NOR gates 22, thereby toggling the corresponding JK flip-flops 24*a–h*, as long as every flip-flop in the preceding chain has its output Q as a binary 1.

The output Q of flip-flops 24*a–h* must settle before the next pulse train input is applied to the circuit. In this regard, toggle logic 16 will not permit any one flip-flop to be toggled into a first stable state unless all flip-flops in the chain preceding the specified flip-flop are already in the same first stable state.

When the flip-flops 24 are all in the first stable state, then $\overline{Q}$ output of flip-flop 24*h* is a binary 0. There is a 1 input to NOR gates 34 and 20*a–h*. Obviously, this can only occur after counter 14 has counted up to its upper limit such that all flip-flops are in the first stable state and their Q output are respectively binary 1.

FIG. 2 is a table showing the sequential operation of the divider 10 of the present invention. The horizontal row of the table numbered 1, 2 and 4 represent the states of the control signal applied to the input terminals 18 of the clock gating logic 12 beginning with the input terminal labeled 2°. For purposes of illustration, the table in FIG. 2 is set up for a division by the number 8, which is then changed to division by the number 6. The curved arrows from one horizontal row to the next indicates the signal counting operation of the counter state storage 14. Assuming that the divisor is the number 8, the counter state storage 14 will begin counting towards the all ONES state which is shown as the last horizontal row in the table. If in the course of the counting sequence, it is desired to change the divisor to the number 6, the divider 10 will not change to the divisor 6 immediately. Instead the divider 10 will continue to count until the all ONES state of the flip-flops 24 has been reached and then as indicated by the large curved arrow in the table, the divisor 6 will be programmed into the divider 10. The divider will then start counting from the state of the counter state storage 14 represented by the divisor 6. Until the divisor is changed, the divider will continue to perform the divide by 6 operation as indicated by the closed loop formed by the solid small and large curved arrows. Therefore, a desirable feature of the present divider is that upon changing the divisor, the divider will continue to count until the all ONES state is reached before changing to the new divisor. This characteristic allows for a smoother and more reliable operation of the circuit.

The divider of the present invention lends itself to a number of applications among which the following are included:

(1) Generate waveforms by programming the divider control inputs with a memory unit; (2) generate hyperbolic FM sweep signals by programming the divider control inputs with a cycling binary counter (the generated sweep would be linear with period). The sweep would be nearly linear with frequency only if the sweep range is much larger than the sweep center frequency; (3) frequency modulate a carrier with a predistorted amplitude signal by programming the divider control inputs with the outputs of an analog to digital converter. The A/D converter would be driven by the predistorted amplitude signal; (4) generate submultiples of master clock frequencies for various data handling and data processing systems.

The flip-flops and NOR gates shown and described herein are standard J–K flip-flops and NOR gates as are described in "Switching Circuits and Logical Design," S. H. Caldwell, Wiley, New York, 1958. It should be understood, of course, that the foregoing disclosure relates to only a preferred embodiment of the invention and that numerous modifications or alterations may be made therein without departing from the spirit and the scope of the invention as set forth in the appended claims.

What is claimed is:

1. A digitally controlled frequency divider comprising:

a pulse source (40) for generating binary pulses at a predetermined repetition rate;

a binary counter including $n$ cascaded bistable switching storage elements (24$a$–$h$);

a source (18) of $n$ bit binary divisor signals;

means (18$a$–$h$; 20$a$–$h$; 22$a$–$h$; 26$g$; 32) coupling the pulse source (40) and the divisor signal means (18) to each storage element (24$a$–$h$) for applying a firs' signal input $a^t$ at time $t$ thereto, if the associatea divisor signal bit condition matches the binary pulse condition, and, if the $n$ bistable storage elements are each in a first stable state;

toggle means (26$a$–$g$; 28$a$–$c$) at each $r$th bistable storage element for applying a second signal input $b^t$ at time $t$ thereto, $r$ being in the range $1 \leq r \leq n$, and if the $r-1$ lesser significant bistable storage elements are each in the first stable state; and means (32, 34–36) coupling the pulse source (40) and the toggle means (26$g$) for gating out a pulse.

2. A digitally controlled frequency divider according to claim 1, wherein the means for applying a first signal input $a^t$ comprises a plurality of cascaded NOR gates.

3. A digitally controlled frequency divider according to claim 1, wherein the output frequency represents the input frequency divided by an integer from 1 to $2^n$.

4. A digitally controlled frequency divider comprising:

a pulse source (40) for generating binary pulses at a predetermined repetition rate;

a binary counter including $n$ cascaded bistable switching storage elements (24$a$–$h$);

a source (18) of $n$ bit binary divisor signals;

means (18$a$–$g$; 20$a$–$g$; 22$a$–$g$; 26$g$; 32) coupling the pulse source (40) and the divisor signal means (18) to each storage element (24$a$–$g$) for applying a first signal input $a^t$ at time $t$ thereto, if the associated divisor signal bit condition matches the binary pulse condition, and, if the $n$ bistable storage elements are each in a first stable state;

toggle means (26$a$–$g$; 28$a$–$c$) at each $r$th bistable storage element for applying a second signal input $b^t$ at time $t$ thereto, $r$ being in the range $1 \leq r \leq n$, if the $r-1$ lesser significant bistable storage elements are in the first stable state, the storage element output Q at time $t+1$ being defined by the truth table:

| $a^t$ | $b^t$ | $Q^{t+1}$ |
|---|---|---|
| 0 | 0 | $\overline{Q^t}$ |
| 0 | 1 | 1 |
| 1 | 0 | 0 |
| 1 | 1 | $Q^t$ |

and means (32, 34–36) coupling the pulse source (40) and the toggle means (26$g$) for gating out a pulse upon the $n$ bistable storage elements being in the first stable state.

References Cited

UNITED STATES PATENTS 3,011,127 11/1961 Thatte ---------- 328—42 X
3,147,442 9/1964 Fritzsche et al. ------- 328—41
3,172,042 3/1965 Dawirs ------------ 328—48
3,287,648 11/1966 Poole ------------ 328—39 X JOHN S. HEYMAN, Primary Examiner S. D. MILLER, Assistant Examiner U.S. Cl. X.R.

307—224, 225; 328—42, 48

UNITED STATES PATENT OFFICE

CERTIFICATE OF CORRECTION

Patent No. 3,493,872 February 3, 1970

Raymond B. Sepe

It is certified that error appears in the above identified patent and that said Letters Patent are hereby corrected as shown below:

Column 4, line 56, after "There is a" insert -- 1 output on line 30 which is inverted by NOR gate 32 to appear as a --.

Signed and sealed this 15th day of December 1970.

(SEAL)
Attest:

Edward M. Fletcher, Jr.
Attesting Officer

WILLIAM E. SCHUYLER, JR.
Commissioner of Patents